(12) United States Patent
Matsumoto

(10) Patent No.: US 9,952,440 B2
(45) Date of Patent: Apr. 24, 2018

(54) IMPRINT APPARATUS, ILLUMINATION OPTICAL SYSTEM, AND ARTICLE MANUFACTURING METHOD

(71) Applicant: CANON KABUSHIKI KAISHA, Tokyo (JP)

(72) Inventor: Takahiro Matsumoto, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 308 days.

(21) Appl. No.: 14/819,804

(22) Filed: Aug. 6, 2015

(65) Prior Publication Data

US 2016/0046045 A1 Feb. 18, 2016

(30) Foreign Application Priority Data

Aug. 13, 2014 (JP) ................................. 2014-164990

(51) Int. Cl.
*G02B 27/09* (2006.01)
*G03F 7/00* (2006.01)
*G03F 9/00* (2006.01)

(52) U.S. Cl.
CPC ..... *G02B 27/0933* (2013.01); *G02B 27/0905* (2013.01); *G02B 27/0927* (2013.01); *G02B 27/0961* (2013.01); *G02B 27/0966* (2013.01); *G03F 7/0002* (2013.01); *G03F 9/7042* (2013.01); *G02F 2203/12* (2013.01)

(58) Field of Classification Search
CPC .................................................. G02B 27/0933
See application file for complete search history.

(56) References Cited

FOREIGN PATENT DOCUMENTS

| JP | 2013089663 A | * | 5/2013 |
| JP | 2013089663 A | | 5/2013 |

* cited by examiner

*Primary Examiner* — Alison L Hindenlang
*Assistant Examiner* — Jamel M Nelson
(74) *Attorney, Agent, or Firm* — Rossi, Kimms & McDowell LLP

(57) ABSTRACT

An imprint apparatus includes: a heating unit configured to heat an imprint region where an imprint process on a substrate is performed and change a shape of the imprint region. The heating unit includes a first optical system configured to emit a light beam extending in a first direction and a second direction perpendicular to an optical axis, a changing unit configured to change a ratio of widths of the light beam emitted from the first optical system in the first direction and the second direction, and an intensity distribution adjusting unit configured to adjust an intensity distribution of the light beam the ratio of which has been changed, and the heating unit heats the imprint region by irradiating the imprint region with the light beam from the intensity distribution adjusting unit.

14 Claims, 6 Drawing Sheets

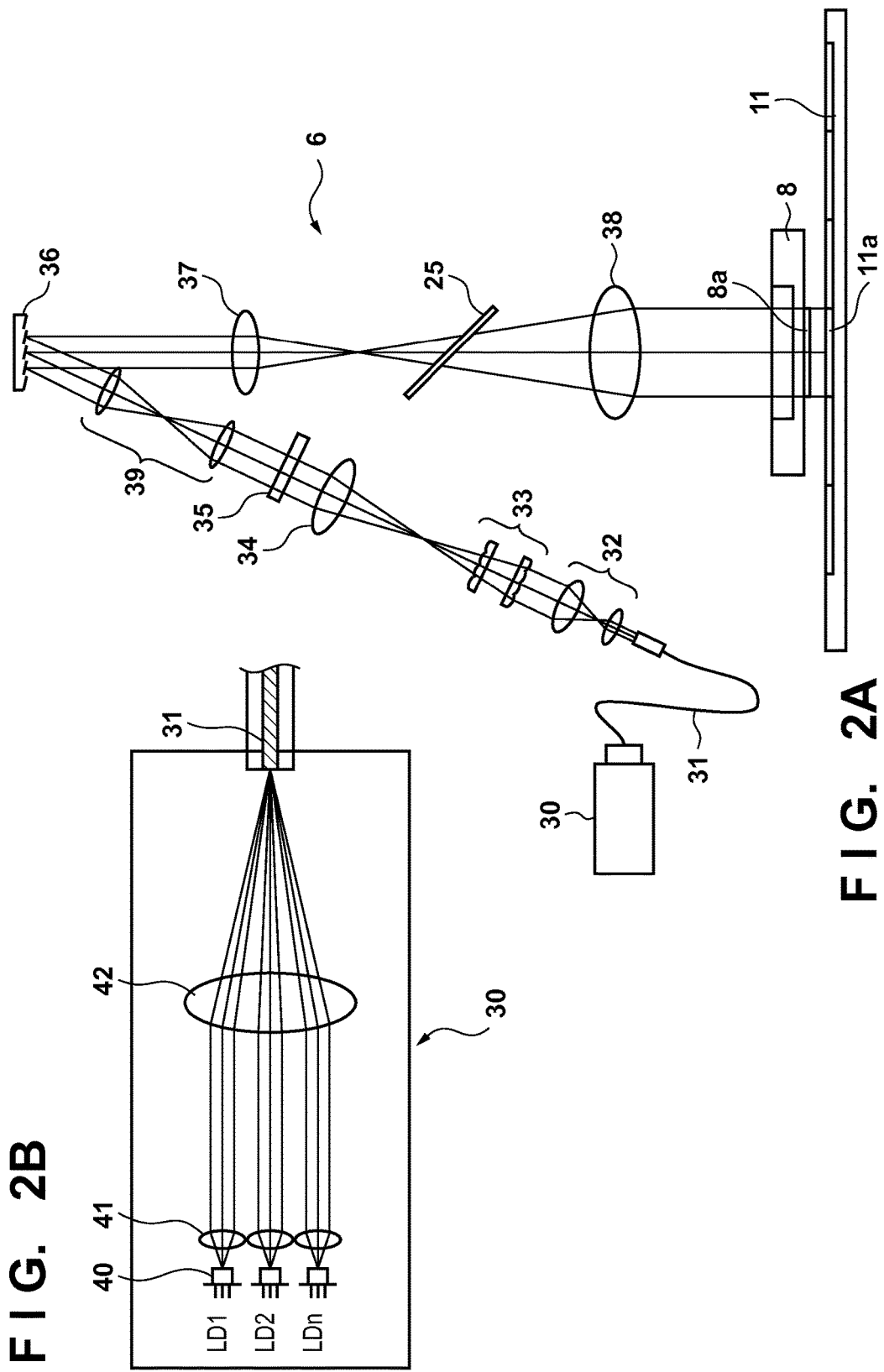

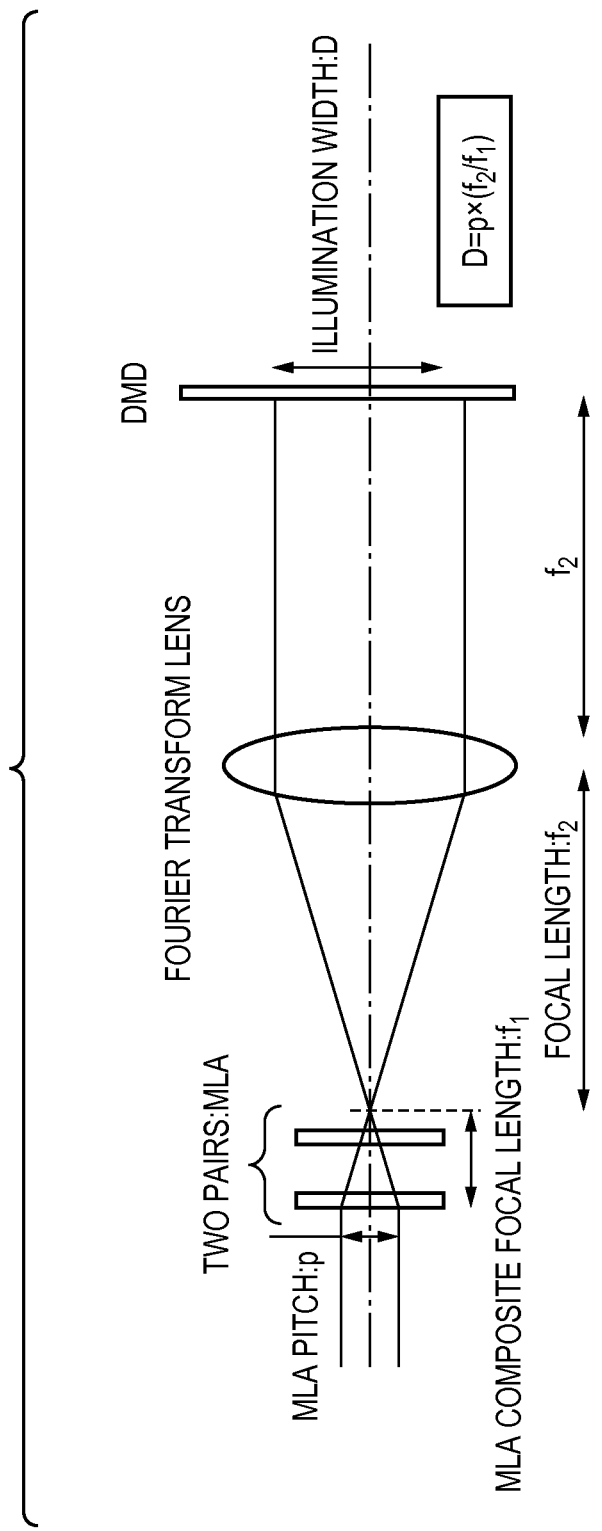

F I G. 5
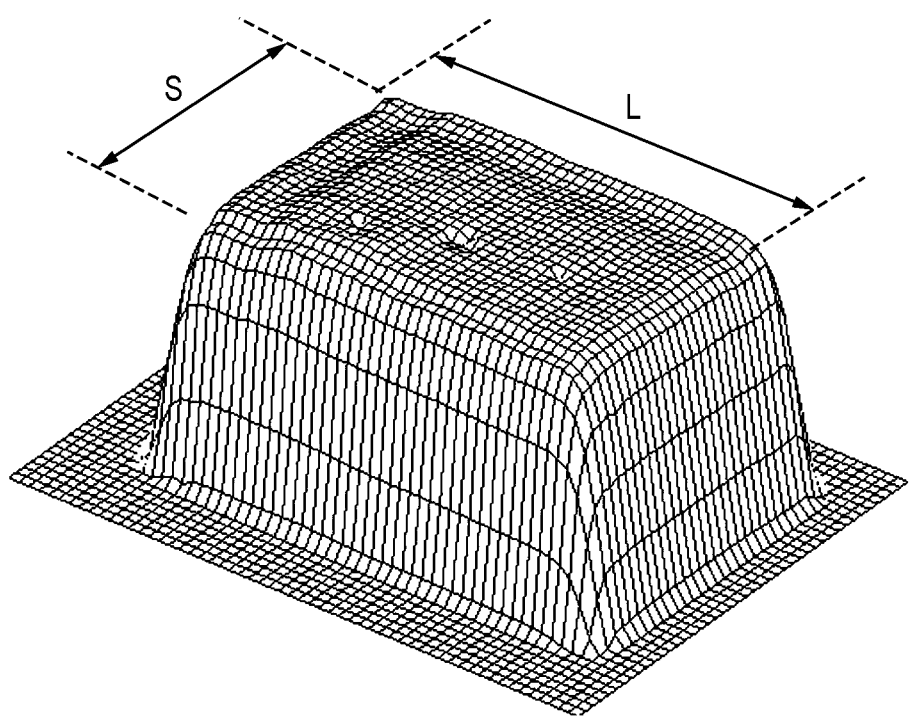

IMPRINT APPARATUS, ILLUMINATION OPTICAL SYSTEM, AND ARTICLE MANUFACTURING METHOD

BACKGROUND OF THE INVENTION

Field of the Invention

The present invention relates to an imprint apparatus, an illumination optical system, and an article manufacturing method.

Description of the Related Art

As demand for micropatterning of a semiconductor device, a MEMS, or the like increases, a microfabrication technique of molding an uncured resin on a substrate using a mold to form a resin pattern on the substrate has received attention, in addition to a conventional photolithography technique. This technique is also called an imprint technique and can form a fine structure of several nm order on the substrate. A photo-curing method is one example of the imprint technique. In an imprint apparatus which adopts this photo-curing method, first, an ultraviolet-curing resin is applied to a shot as an imprint region on the substrate. Next, the uncured resin is molded using the mold. Then, the resin is irradiated with an ultraviolet beam and cured, and the mold is released from the cured resin, thereby forming the resin pattern on the substrate. It can be said that the imprint apparatus is a semiconductor manufacturing apparatus capable of achieving a lower cost as compared with a conventional optical stepper, optical scanner, or EUV exposure apparatus because it does not need a projection optical system which reduces and projects a reticle pattern on the substrate.

The substrate to undergo an imprint process may be enlarged or reduced, and the shape (or the size) of the pattern may change in the biaxial direction perpendicular to each other in a plane after a heating treatment in a deposition step such as sputtering in a series of device manufacturing processes. Therefore, the imprint apparatus needs to match the shape of a substrate-side pattern that has been formed on the substrate beforehand with the shape of a die-side pattern portion that has been formed on the mold when bringing the mold and the resin on the substrate into contact with each other.

Japanese Patent Laid-Open No. 2013-89663 describes an imprint apparatus which includes a heating mechanism for heating a substrate-side pattern in order to match the shape of the substrate-side pattern with the shape of a mold pattern portion. The heating mechanism described in Japanese Patent Laid-Open No. 2013-89663 includes a liquid crystal element array or a digital mirror device as a spatial light modulation device which forms a light amount distribution in the planar region of the substrate-side pattern.

In the invention described in Japanese Patent Laid-Open No. 2013-89663, an illuminance is controlled by using, as the spatial light modulation device, digital micromirror devices (DMDs) positioned in a matrix or liquid crystal elements positioned in the matrix to tilt an arbitrary micromirror by a predetermined angle. Although not described in the invention described in Japanese Patent Laid-Open No. 2013-89663, a microlens array (MLA) or the like is generally used such that light which irradiates the DMDs has a top flat and uniform intensity distribution. The shot size of a wafer typically has a rectangular shape of 33×26 mm. In consideration of using a lower power light source to reduce the cost of the light source, the efficiency of an optical system needs to be increased. Therefore, the illumination width of illumination light to the DMDs is required to have a similar figure to the shot size. However, Japanese Patent Laid-Open No. 2013-89663 does not disclose that the illumination width of illumination light to the DMDs has the similar figure to the shot size.

A method which is performed as a conventional technique of changing the shape of illumination light to a DMD from a square to a rectangle will be described with reference to FIG. 4. In FIG. 4, letting P be the lens array pitch of an MLA, $f_1$ be the composite focal length of two lenses of the MLA, and $f_2$ be the each focal length of a Fourier transform lens, an illumination width D for a DMD plane can be obtained from $D=P\times(f_2/f_1)$. From this equation, the MLA pitch P or the focal length of the MLA needs to be changed between the X direction and the Y direction such that illumination light to the DMD has a similar figure to a shot size. In this case, the cost of an optical system increases because of the need to produce a special MLA. On the other hand, if the efficiency of the optical system is decreased as a result of keeping the cost of the optical system low, a higher output light source becomes required and the cost of the light source increases. As described above, if a method of improving an overlay accuracy by thermally deforming the pattern is applied to the imprint apparatus, the cost increases. This is contrary to a cost reduction which is one of advantages of the imprint apparatus.

SUMMARY OF THE INVENTION

The present invention provides an imprint apparatus advantageous in terms of an overlay accuracy.

The present invention in its first aspect provides an imprint apparatus which performs an imprint process of forming a pattern on an imprint material of a substrate by bringing the imprint material and a mold pattern into contact with each other, the apparatus comprising: a heating unit configured to heat an imprint region where the imprint process on the substrate is performed and change a shape of the imprint region, wherein the heating unit includes a first optical system configured to emit a light beam extending in a first direction and a second direction perpendicular to an optical axis, a changing unit configured to change a ratio of widths of the light beam emitted from the first optical system in the first direction and the second direction, and an intensity distribution adjusting unit configured to adjust an intensity distribution of the light beam the ratio of which has been changed, and the heating unit heats the imprint region by irradiating the imprint region with the light beam from the intensity distribution adjusting unit.

The present invention in its second aspect provides a method of manufacturing an article, the method comprising: forming a pattern on a substrate by using an imprint apparatus defined in the first aspect; and processing the substrate, on which the pattern has been formed, to manufacture the article.

The present invention in its third aspect provides an illumination optical system comprising: a first optical system configured to emit a light beam extending in a first direction and a second direction perpendicular to an optical axis; a changing unit configured to change a ratio of widths of the light beam emitted from the first optical system in the first direction and the second direction; and an intensity distribution adjusting unit configured to adjust an intensity distribution of the light beam the ratio of which has been changed, wherein the first optical system includes a lens array configured to uniformize an intensity distribution of light from a light source, the lens array including a plurality of lenses arrayed two-dimensionally, and the changing unit includes a lens positioned in an optical path between the lens array and the intensity distribution adjusting unit, and having a lens surface which curvatures in two different directions are different from each other, and the lens having the lens surface changes the ratio of the width in the first direction and the second direction of light incident on the intensity distribution adjusting unit.

Further features of the present invention will become apparent from the following description of exemplary embodiments with reference to the attached drawings.

BRIEF DESCRIPTION OF THE DRAWINGS

FIGS. 2A and 2B are views showing an illumination optical system according to the present invention;

FIG. 4 is a view for explaining an illumination width when an MLA is used;

FIG. 5 is a view for explaining the ratio of a top flat intensity distribution and the illumination width according to the present invention.

DESCRIPTION OF THE EMBODIMENTS

An embodiment of the present invention will now be described below with reference to the accompanying drawings or the like.

[Imprint Apparatus]

Figure 1:
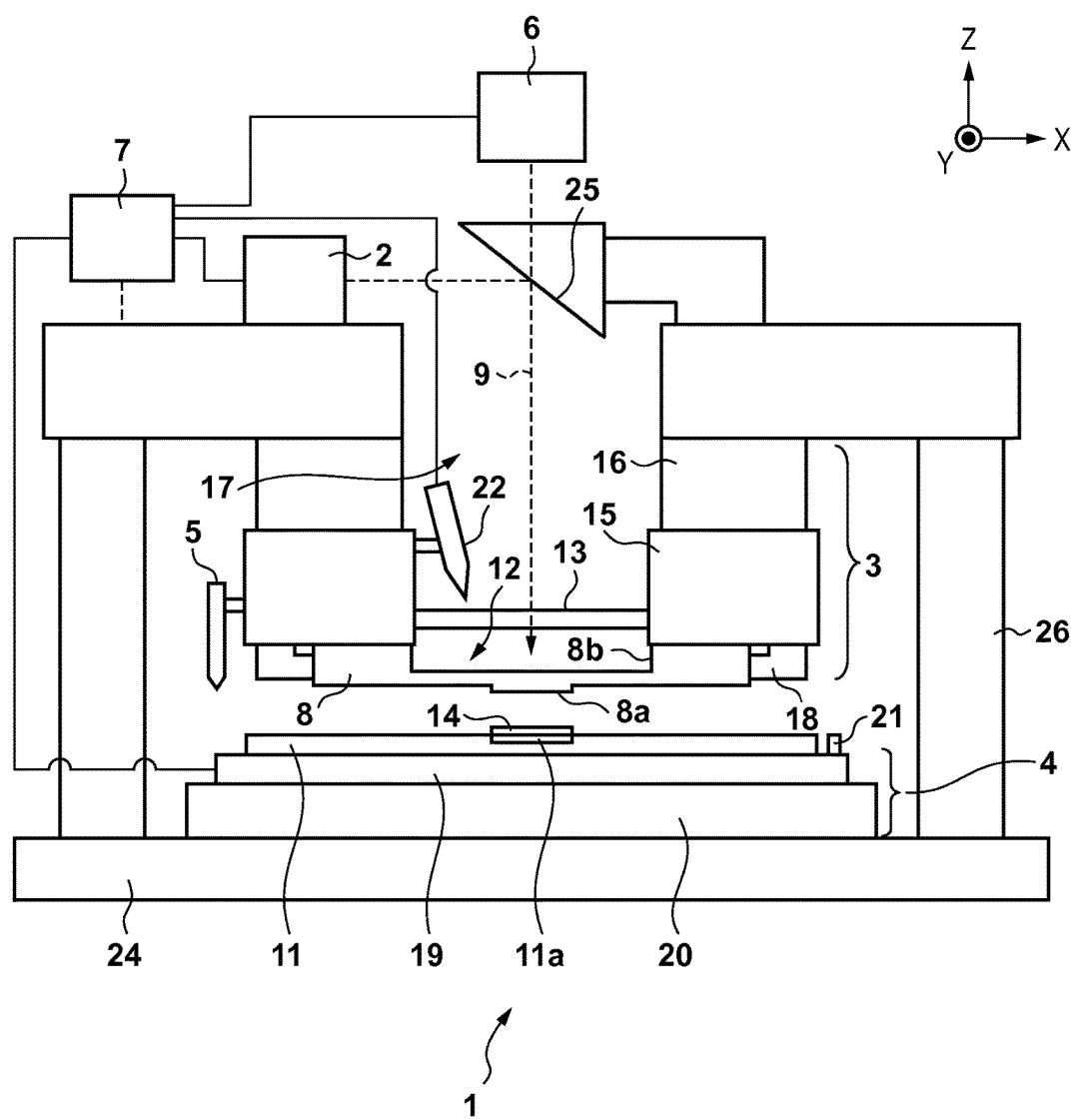
FIG. 1 is a schematic view showing an imprint apparatus according to the present invention.

The arrangement of an imprint apparatus according to an embodiment of the present invention will be described. FIG. 1 is a schematic view showing the arrangement of the imprint apparatus according to this embodiment. The imprint apparatus is used to manufacture a device such as a semiconductor device as an article, molds an uncured resin (imprint material) on a wafer (substrate) by pressing the resin against a mold (an original or a template) to bring them into contact with each other, and forms a resin pattern on the substrate. In this embodiment, the imprint apparatus which adopts a photo-curing method is used. Referring to FIG. 1, a Z-axis is set in a direction perpendicular to the surface of the substrate, and the X-axis and the Y-axis perpendicular to each other in a plane perpendicular to the Z-axis are set.

An imprint apparatus 1 includes an irradiation unit 2, a mold holding unit 3, a wafer stage (substrate stage) 4, a dispensing unit (dispenser) 5, a heating unit (illumination optical system) 6, a control unit 7, and an alignment measuring device (position deviation detector) 22. In an imprint process, the irradiation unit 2 irradiates a mold 8 with an ultraviolet beam 9 which cures the resin. Although not shown, the irradiation unit 2 includes a light source and an optical element configured to adjust the ultraviolet beam 9 from this light source to light suitable for imprinting. In this embodiment, the irradiation unit 2 is installed in order to adopt the photo-curing method. However, if, for example, a thermal curing method is adopted, a heat source unit configured to cure a thermosetting resin is installed in place of the irradiation unit 2.

The mold 8 has a rectangular outer shape and includes a pattern portion 8a three-dimensionally formed on a surface on the side of a substrate 11. The pattern portion 8a has, for example, a three-dimensional pattern such as a circuit pattern that should be transferred. The mold 8 is made of a material such as quartz capable of transmitting the ultraviolet beam 9. Further, the mold 8 may include, on the side of the irradiation unit 2, a cavity (concave portion) 8b configured to facilitate deforming the mold 8. The cavity 8b has a circular planar shape. The thickness (depth) of the cavity 8b is set depending on the size and the material of the mold 8. A light-transmissive member 13 having a space 12, as an enclosed space, enclosed with the cavity 8b and a part of an aperture region 17 in the mold holding unit 3 to be described later may be installed in this aperture region 17. A pressure regulating unit (not shown) may regulate a pressure in the space 12. For example, the pattern portion 8a is flexed into a convex shape toward the substrate 11 and contacts the resin 14 from the central portion of the pattern portion 8a by setting, using the pressure regulating unit, the internal pressure of the space 12 to be higher than the external pressure when pressing the mold 8 against a resin 14 on the substrate 11. This makes it possible to prevent a gas (air) from being trapped between the pattern portion 8a and the resin 14, and completely fill the three-dimensional portion of the pattern portion 8a with the resin 14.

The mold holding unit 3 includes a mold chuck 15 which draws and holds the mold 8 by a vacuum suction force or an electrostatic force, and a mold driver 16 which holds this mold chuck 15 and moves the mold 8 (mold chuck 15). The mold chuck 15 and the mold driver 16 have the aperture region 17 at their center portions (insides) so as to irradiate the substrate 11 with the ultraviolet beam 9 from the light source of the irradiation unit 2. The mold holding unit 3 includes, on the holding side of the mold 8 in the mold chuck 15, a mold correction unit 18 which corrects the shape of the mold 8 (pattern portion 8a) by applying an external force to the side surface of the mold 8 or displacing it. By deforming the shape of the mold 8, the mold correction unit 18 can match the shape of the pattern portion 8a formed on the mold 8 with the shape of a substrate-side pattern 11a that has been formed on the substrate 11 beforehand.

The mold driver 16 moves the mold 8 in the Z direction so as to selectively press the mold 8 against the resin 14 on the substrate 11 or release the mold 8 from the resin 14 on the substrate 11. An actuator adoptable to this mold driver 16 includes, for example, a voice coil actuator, a linear motor or an air cylinder. The mold driver 16 may be made of a plurality of driving systems (devices) such as a coarse driving system (device) and a fine driving system (device) to cope with accurate positioning of the mold 8. The mold driver 16 may have, for example, a position adjustment function not only in the Z direction but also in the X direction, the Y direction, or the θ direction (rotational direction around the Z-axis), and a tilt function of correcting the tilt of the mold 8. A pressing operation and a releasing operation in the imprint apparatus 1 may be implemented by moving the mold 8 in the Z direction as described above. However, they may be implemented by moving the substrate stage 4 in the Z direction or may relatively move both the mold 8 and the substrate stage 4.

The substrate 11 includes, for example, a single-crystal silicon substrate and an SOI (Silicon On Insulator) substrate. The ultraviolet-curing resin 14 molded by the pattern portion 8a that has been formed on the mold 8 is applied to the processed surface of the substrate 11. The substrate stage 4 holds the substrate 11, and performs alignment between the mold 8 and the resin 14 when pressing the mold 8 against the resin 14 on the substrate 11. The substrate stage 4 includes a wafer chuck 19 which holds the substrate 11 by a suction force, and a stage driver 20 which mechanically holds this wafer chuck 19 and is movable within the X-Y plane.

Particularly, the wafer chuck 19 according to this embodiment includes, although not shown, a plurality of suction units which can suck and hold the back surface of the substrate 11 in a plurality of regions. Each of these suction units is connected to a pressure regulating unit other than the one described above.

The pressure regulating unit holds the substrate 11 on a chuck surface by regulating the pressure between the substrate 11 and each suction unit to be lower and generating a suction force, and also can change a pressure value (suction force) independently in each suction unit. Note that the number of divisions (the number of installations) of the suction units is not particularly limited but may be an arbitrary number. The substrate stage 4 includes a reference mark 21 to be used when aligning the mold 8 onto its surface. The stage driver 20 can adopt, for example, the linear motor as the actuator. The stage driver 20 may also be made of the plurality of driving systems (devices) such as the coarse driving system (device) and the fine driving system (device) in the X direction and the Y direction. Furthermore, the stage driver 20 may have, for example, a driving system (device) for position adjustment in the Z direction, a position adjustment function of the substrate 11 in the θ direction, or a tilt function of correcting the tilt of the substrate 11. The substrate stage 4 aligns the substrate 11 with the mold 8.

The dispensing unit 5 dispenses the uncured resin 14 onto the substrate 11. The resin 14 is a resin (imprint material) cured by the ultraviolet beam 9 and is selected appropriately in accordance with various conditions such as a semiconductor device manufacturing process. The amount of the resin 14 discharged from a discharge nozzle of the dispensing unit 5 is also determined appropriately by the desired thickness of the resin 14 formed on the substrate 11, the density of a pattern to be formed, or the like. The heating unit 6 irradiates and heats the substrate 11 so as to correct the shape of the substrate 11 placed on the substrate stage 4, and more specifically, the shape of the substrate-side pattern 11a that has been formed beforehand on the substrate 11 loaded into the imprint apparatus 1. Light from the light source of the heating unit 6 is light whose light curable resin is not sensitized (cured) and whose wavelength exists in a certain wavelength band absorbed into the substrate 11. The ultraviolet beam from the irradiation unit 2 and light from the heating unit 6 are combined by a dichroic mirror 25, and enter the substrate 11. The arrangement of the heating unit 6 will be described later.

The control unit 7 controls, for example, the operation and adjustment of each component of the imprint apparatus 1. The control unit 7 is formed by, for example, a computer, connected to each component of the imprint apparatus 1 via a line, and controls each component in accordance with a program or the like. Note that the control unit 7 may be constituted together with another portion of the imprint apparatus 1 (within a common housing) or separately from the other portion of the imprint apparatus 1 (within another housing).

The imprint apparatus 1 includes the alignment measuring device (detector) 22 in the aperture region 17. This alignment measuring device 22 measures, as a substrate alignment or the like, the position deviations in the X direction and the Y direction between the alignment mark formed on the substrate 11 and the alignment mark formed on the mold 8. The imprint apparatus 1 includes a base surface plate 24 on which the substrate stage 4 is placed, a bridge surface plate to which the mold holding unit 3 is fixed, and a column 26 configured to support the bridge surface plate. The imprint apparatus 1 further includes a mold conveying mechanism which conveys the mold 8 from outside the apparatus to the mold holding unit 3 and a substrate conveying mechanism which conveys the substrate 11 from outside the apparatus to the substrate stage 4, both of which are not shown. The arrangement of the imprint apparatus of the present invention has been described above.

[Heating Unit]

The heating unit 6 will be described in detail with reference to FIGS. 2A and 2B. As shown in FIG. 2A, light from a light source unit 30 for heating uses an optical fiber 31 and is guided into a chamber which encloses the imprint apparatus 1. The light source unit 30 includes high-output laser light sources 40 and is installed in a place away from the imprint apparatus 1 because it generates a large amount of heat. As shown in FIG. 2B, the light source unit 30 uses several to several tens of the commercial blue LDs (laser light sources) 40 each having an output of 1.3 to 1.6 W and a wavelength of 435 to 455 nm to obtain an output of 10 to 60 W. Light beams from the plurality of blue LDs 40 are made almost parallel to each other by respective collimator lenses 41, and then condensed to the core portion of the optical fiber 31 by a lens 42. The optical fiber 31 having a core diameter of 800 μm to 1.6 mm and an NA of about 0.22 can be used. Selections of the core diameter and the NA of the optical fiber 31 are determined by the capability of coupling the light beams from the blue LDs 40 to the fiber efficiently, and further the specifications of an MLA (microlens array) 33 which forms an optical system (homogenizer) uniformizing a light intensity distribution to be described later. The MLA 33 is formed by a plurality of microlenses arrayed two-dimensionally. Light emitted from the optical fiber 31 causes an enlarging optical system 32 to enlarge its beam diameter and irradiates the MLA 33. The microlenses which form the MLA used in this embodiment have the same focal length in the X direction (first direction) and the Y direction (second direction), and arrayed with the same pitch in the X direction and the Y direction. The light source unit 30, the optical fiber 31, the enlarging optical system 32, and the MLA 33 form the first optical system which emits a light beam extending in the first direction and the second direction perpendicular to an optical axis.

The optical fiber having a core diameter of φ0.8 mm and an NA of 0.22, and a 12.25× enlarging optical system 32 are used to perform critical illumination on the MLA 33 by φ9.8 mm. Two lenses each having a specification of an outer shape of 10 mm, a focal length of 13.8 mm, and an array pitch of 0.5 mm (both in the X and Y directions) are used for the MLA 33. The two lenses of the MLA 33 are positioned at the spacing of an almost focal length. At this time, light tilted by 0.22/12.25=0.0180 radians at maximum enters the first-stage lens of the MLA 33. An angle which the center of the first-stage lens of the MLA 33 forms with the edge of the adjacent second-stage lens of the MLA 33 is 0.25/13.8=0.0181 radians. Therefore, when light tilted by the maximum angle enters the second-stage lens of the MLA 33, it never enters the adjacent lens of the MLA 33. On the condition that light enters the adjacent lens, ghost light is generated in illumination on the plane of a digital mirror device (DMD) 36. This causes problems such as a decrease in utilization efficiency and occurrence of stray light by ghost light. Therefore, the MLA 33 needs to be carefully designed to prevent light from entering the adjacent lens. The DMD includes a plurality of mirror elements and adjusts the light intensity distribution by controlling the planar directions of the plurality of mirror elements individually. In place of the DMD, a liquid crystal device can be used to adjust the light intensity distribution. The liquid crystal device includes a plurality of liquid crystal elements and adjusts the intensity distribution by controlling voltages for the plurality of liquid crystal elements individually. Note that the MLA 33 having the same pitch in the X direction and the Y direction is available as a standard product from SUSS MicroOptics and can be used at low cost.

Light that has passed through the MLA 33 enters a Fourier transform lens 34, and emits light beams each having an uniformized intensity distribution and a rectangular shape. If the intensity distribution of light entering the DMD 36 is not uniform and is, for example, a Gaussian distribution, a light intensity in the peripheral region of the DMD 36 decreases. Light having the uniformized intensity distribution and the rectangular shape obliquely enters the DMD 36 via a cylindrical lens 35 (having the power of a convex lens in a direction perpendicular to the drawing surface) and a relay lens 39. The DMD 36 is formed by micromirrors each having a size of, for example, 1,000×700. Reflected light in each micromirror controls an irradiation dose onto the substrate 11 by changing each micromirror by ±12 degrees. An incident angle on the DMD 36 is set to 24 degrees by using the surface of each micromirror in the deflection direction as an incident surface so that light can reflect vertically with respect to the chip surface of the DMD 36. The positions of the Fourier transform lens 34, the cylindrical lens 35, and the relay lens 39 will be described later. The DMD 36 forms an intensity distribution adjusting unit which adjusts the intensity distribution of each light beam whose ratio of the width in the first direction and the second direction has been changed by the cylindrical lens 35.

Light reflected by the DMD 36 and having the rectangular shape is enlarged and projected on the mold 8 and the substrate 11 by a projection optical system made by a lens 37 and a lens 38. Note that the dichroic mirror 25 in an optical path is arranged to transmit light from the blue lasers 40 and reflect light from the irradiation unit (light source of the ultraviolet beam) 2. The DMD 36 and the substrate 11 have a conjugate relationship with respect to the projection optical system formed by the lens 37 and the lens 38, and have an enlargement magnification in consideration of the ratio of the shot size of the substrate 11 and the effective use area of the DMD 36.

[Imprint Process]

Figure 6:
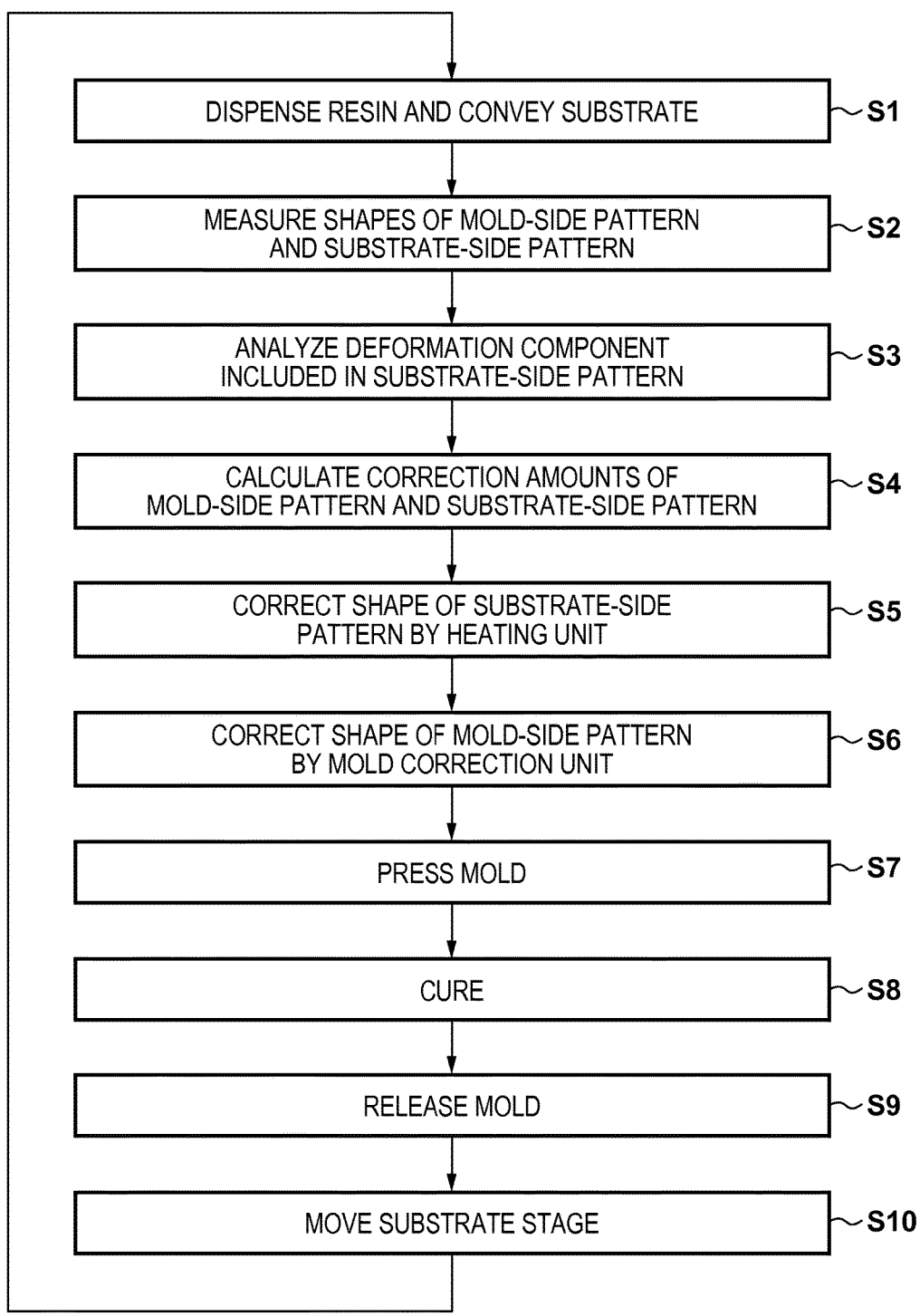
FIG. 6 is a flowchart showing an imprint process according to the present invention.

The imprint process performed by the imprint apparatus 1 will be described below with reference to a flowchart shown in FIG. 6. First, the resin 14 is applied to a shot region serving as the imprint region on the substrate 11. Then, the substrate 11 is conveyed under the mold 8 by the stage driver 20 (step S1). Next, the shape of the mold-side pattern 8a and the shape of the substrate-side pattern 11a are obtained from the detection result of the alignment measuring device (detector) 22 (step S2). A result obtained by measuring the shape of the mold-side pattern 8a and the shape of the substrate-side pattern 11a before the imprint process may be used. The control unit 7 receives these measurement results, and a deformation component included in the substrate-side pattern 11a is analyzed (step S3). The control unit 7 calculates, from an analysis result, the mold correction amount of the mold-side pattern 8a and the substrate correction amount of the substrate-side pattern 11a (step S4).

Next, based on the substrate correction amount, the control unit 7 determines an irradiation dose distribution and the substrate 11 is irradiated with light whose irradiation dose distribution is formed by the DMD 36 serving as the spatial light modulation device. A temperature distribution corresponding to the irradiation dose distribution is formed on the substrate 11. The shape of the substrate-side pattern 11a is corrected by thermally deforming the substrate-side pattern 11a (step S5). The control unit 7 controls the operations of the DMD 36 and the light source unit 30 for heating by using the determined irradiation dose distribution as an indicator. Furthermore, based on the mold correction amount, the mold correction unit 18 applies the force to the mold 8 to correct the shape of the mold-side pattern 8a (step S6). When shape correction of the mold-side pattern 8a and the substrate-side pattern 11a has finished, a mold pressing operation of bringing the mold 8 and the substrate 11 into contact with each other via the resin 14 is performed (step S7).

In the mold pressing operation (step S7), the mold driver 16 is driven to press the mold 8 against the resin 14 on the substrate 11. By this pressing operation, the resin 14 fills the three-dimensional portion of the mold-side pattern 8a. In this state, the resin 14 is cured by the ultraviolet beam 9 from the irradiation unit 2 as a curing process (step S8). Then, after curing the resin 14, the mold driver 16 is driven again to separate the mold 8 from the resin 14 as a mold releasing process (step S9). As a result, the pattern (layer) of the resin 14 having a three-dimensional shape conforming to the three-dimensional portion of the mold-side pattern 8a is molded on the surface of the substrate-side pattern 11a. After that, the substrate stage 4 is driven to apply the resin 14 to the next mold pressing position (step S10). A plurality of patterns can be molded on the one substrate 11 by sequentially performing such a series of imprint processes while changing the imprint region by driving the substrate stage 4. As described above, the present invention can use light for heating effectively by using the heating unit including an illumination shape changing unit to achieve a lower cost and wider stroke. Furthermore, the present invention can correct the mold 8 and the pattern shape on the substrate 11 accurately, and achieve accurate overlay.

[Illumination Shape Changing Unit]

Figure 3A:
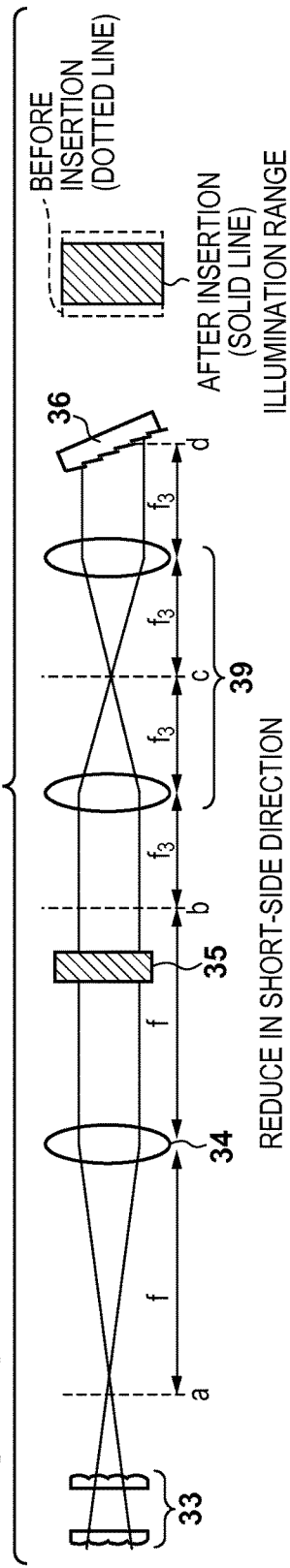
FIGS. 3A to 3C are views showing a changing unit according to the present invention.
Figure 3B:
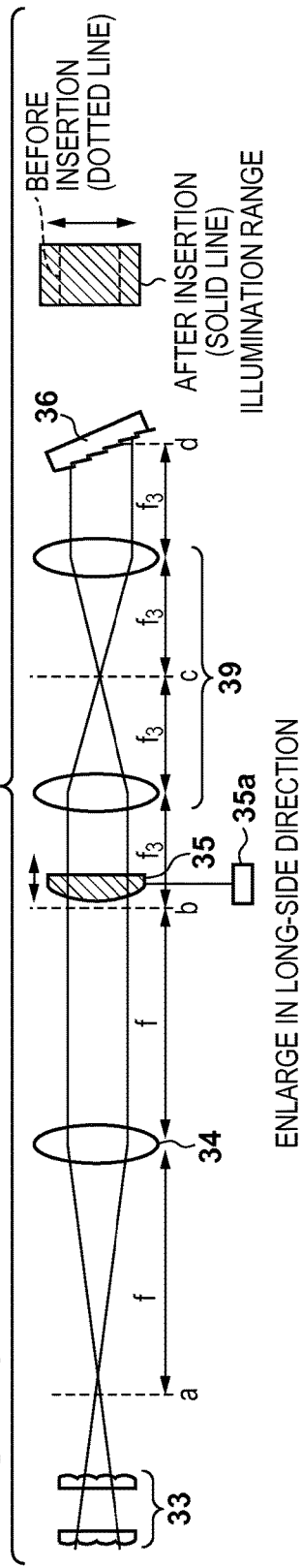
Figure 3C:
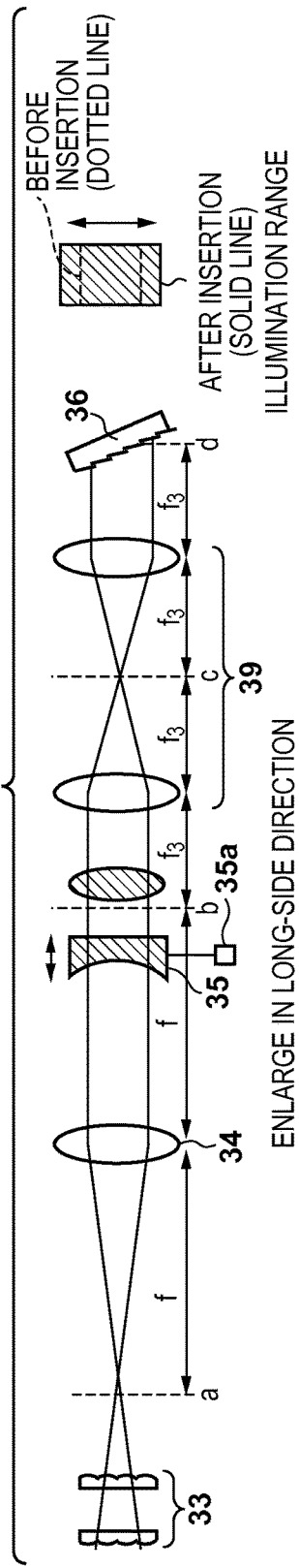

Examples of the position of the cylindrical lens 35 which forms a changing unit for changing the rectangular shape of light entering the DMD 36 of the heating unit (illumination optical system) 6 will be described with reference to FIGS. 3A to 3C.

Example 1

Example 1 of the changing unit for the rectangular shape of light entering a DMD 36 will be described with reference to FIG. 3A. A focal length of a Fourier transform lens 34 is f, and a relay lens 39 is formed by two lenses each having a focal length $f_3$. In FIG. 3A, the Fourier transform lens 34 is positioned so as to match an a plane serving as the composite focal position of the two lenses of an MLA 33 with the front focus position of the Fourier transform lens 34. Subsequently, a cylindrical lens 35 having the power of the convex lens in the direction perpendicular to the drawing surface is positioned in front of a back focus position b of the Fourier transform lens 34, thereby making a beam width in the direction perpendicular to the drawing surface at the focus position b smaller than a beam width within the drawing surface. The first relay lens 39 is positioned away from the back focus position b of the Fourier transform lens 34 by $f_3$. The second relay lens 39 is positioned farther away from the position of the first relay lens 39 by $2f_3$. Furthermore, the DMD 36 is positioned away from the second relay lens 39 by $f_3$.

A top flat and uniform light intensity distribution can be formed in the b plane by the MLA 33 and the Fourier transform lens 34. Strictly speaking, a focus shift from the b plane and defocus are caused by the cylindrical lens 35 in the direction perpendicular to the drawing surface. However, the amount of blur of a beam edge portion caused by the defocus is small because the NA of light entering the b plane is originally small. Note that letting φ be the beam size of illumination light to the MLA, the NA of light entering the b plane is calculated from φ/(2f) by using a focal length f of the Fourier transform lens 34. Assuming that the focal length f of the Fourier transform lens 34 is 300 mm, the NA is 9.8/2/3000=0.016 and is a small value of about 1 degree if converted into an angle.

Since the b plane has a conjugate relationship with a d plane serving as the DMD plane, the relay lens 39 directly projects an intensity distribution of the b plane on the DMD 36. The right portion of FIG. 3A shows the illumination range of the DMD 36 when the DMD 36 is viewed from the optical axis direction of the illumination optical system. This illumination range represents the shape (illumination shape) of illumination light entering the DMD 36 from the relay lens 39 in a section perpendicular to the optical axis of the illumination optical system. If the cylindrical lens 35 is not inserted, the square illumination shape is obtained, as indicated by broken lines. To the contrary, by inserting the convex cylindrical lens 35 serving as a mechanism for changing the illumination shape and having a convex surface (positive power), it is possible to change the length ratio of two sides of the rectangular illumination shape and obtain a hatched rectangular illumination shape. FIG. 5 shows a state in which a top flat light intensity distribution is formed in a rectangular illumination shape formed by a long side L and a short side S by using the convex cylindrical lens as the mechanism for changing such a rectangular shape. In Example 1, if there is no cylindrical lens 35, the width (illumination width) of one side of the square illumination shape is changed from L to S (L>S) by using the cylindrical lens 35.

As shown in FIG. 5, the width (illumination width) of the illumination shape is defined as a width in a top flat region. For example, when a peak light intensity is set to 1, a width having the light intensity of 0.9 or more is defined as the illumination width. This value can be changed depending on the specifications of illuminance unevenness. The light intensity may be, for example, 0.95 or more. This ratio of L and S is designed to be equal to the ratio of 33 mm and 26 mm serving as a shot size and become a similar figure. Furthermore, the magnification of the projection optical system made by the lens 37 and the lens 38 shown in FIG. 2A equals their similitude ratio. This makes it possible to illuminate, by the DMD 36, an entire shot size region on the substrate 11 with light of the top flat region and use light efficiently. If the DMD 36 is illuminated in the square illumination shape, some mirror elements of the DMD 36 in a range illuminated in the square are offset (deflected by −12 degrees) and controlled not to irradiate the substrate 11 such that the ratio of L and S becomes equal to the ratio of 33 mm and 26 mm serving as the shot size. Consequently, {(33−26)/33}×100=21% of light is lost in total. In Example 1, this loss of light is eliminated and high efficiency is achieved. From another viewpoint, an effect of increasing a stroke for correcting the pattern shape is also obtained because the deformation amount of the substrate 11 can be increased by 21% when using a light source having an output kept unchanged. In addition, low cost can be kept because it is only necessary to use a standard MLA 33 having the same pitch in the X direction and the Y direction, and add the cylindrical lens 35 and the relay lens 39.

In FIG. 2A, when light obliquely enters the DMD 36, the Fourier transform lens 34 and the cylindrical lens 35 may spatially interfere with the lens 37 of the projection optical system. The relay lens 39 is provided to avoid this. Therefore, depending on the design values of the optical system, an arrangement in which the relay lens 39 is omitted and the DMD 36 is positioned in the b plane shown in FIG. 3A is also possible. The irradiation dose distribution can be formed within the irradiation surface of the substrate 11 by controlling the irradiation dose using many mirrors of the DMD 36. With this irradiation dose distribution, an arbitrary temperature distribution can be formed on the substrate 11. In this Example 1, the DMD has been used as the spatial light modulation device. However, a liquid crystal element array may be used as the spatial light modulation device to form an illuminance distribution on the substrate 11, thereby forming an arbitrary temperature distribution.

The pattern shape on the substrate 11 is slightly deformed by the process of a semiconductor process. Deformation of the pattern shape is roughly classified into a magnification component, a parallelogram component, a trapezoid component, an arcuate component, and a barrel component, and is often made by a combination thereof. In order to correct each deformation component, a temperature distribution for obtaining each necessary correction amount needs to be formed in the shot on the substrate 11. The correction amount of the shot shape on the substrate 11 is calculated from an alignment measurement result, a temperature distribution and an irradiation dose needed to correct the pattern shape are calculated, and the heating unit 6 is controlled by the control unit 7.

Example 2

A mechanism for deforming the rectangular shape of light entering a DMD 36 in Example 2 will be described with reference to FIG. 3B. Light that has passed through an MLA 33 enters the Fourier transform lens 34, and obliquely enters the DMD 36 via a cylindrical lens 35 having the power (positive power) of the convex lens in the direction within the drawing surface and a relay lens 39. A focal length of the Fourier transform lens 34 is f, and the relay lens 39 is formed by the two lenses each having a focal length $f_3$. In FIG. 3B, the Fourier transform lens 34 is positioned so as to match an a plane serving as the composite focal position of the two lenses of the MLA 33 with the front focus position of the Fourier transform lens 34. Subsequently, the convex cylindrical lens 35 having the power of the convex lens in the direction parallel to the drawing surface is positioned behind a back focus position b of the Fourier transform lens 34. The first relay lens 39 is positioned away from the back focus position b of the Fourier transform lens 34 by $f_3$. The other relay lens 39 is positioned farther away from the position of the first relay lens 39 by $2f_3$. Furthermore, the DMD 36 is positioned away from the other relay lens 39 by $f_3$. In FIG. 3B, the relay lenses 39 images, at an equal magnification, the intensity distribution of the b plane in the DMD plane in the direction perpendicular to the drawing surface.

On the other hand, the illumination width in the b plane is enlarged and illuminated, in the direction within the drawing surface, by the cylindrical lens 35 positioned behind the b plane and having the convex power. As shown in the right portion of FIG. 3B, while the illumination shape before inserting the cylindrical lens 35 is the square, the aspect ratio (horizontal to vertical ratio) of the illumination shape is changed and the hatched rectangular illumination shape is obtained by inserting the cylindrical lens 35 serving as the mechanism for changing the rectangular shape. The long side of the illumination shape is matched with the long side (33 mm) of the shot on a substrate 11, and the short side of the illumination shape is matched with the short side of the shot. In this Example, the illumination width on the long side of the illumination shape can be changed by driving, using a driver 35a, the cylindrical lens 35 in the optical axis direction. As described above, the width of illumination to the DMD 36 can be changed by controlling the driving amount of the driver 35a. It is therefore possible to use the light intensity efficiently without decreasing it even if the shot size of the substrate 11 has been changed. Note that ranges indicated by dotted lines before inserting the cylindrical lens 35 are different in FIGS. 3A and 3B. As seen from the previous description made with reference to FIG. 4, an arrangement can be made easily by changing the focal length and the array pitch of the MLA 33 or a focal length f of the Fourier transform lens 34.

The shot layout of the substrate 11 is determined by the shot size and the shot size is determined by the chip size of the semiconductor device, thereby obtaining the shot layout which effectively uses the substrate 11. An optical scanner exposure apparatus can change a size in a scanning direction by changing a scanning distance. When the imprint apparatus of the present invention is used in Mix and Match with the optical scanner exposure apparatus, it is possible to flexibly cope with the shot size that has been changed by changing the scanning distance in the scanning direction.

Example 3

A mechanism for deforming the rectangular shape of light entering a DMD 36 in Example 3 will be described with reference to FIG. 3C. In Example 2, the convex cylindrical lens 35 having the convex surface in a direction parallel to the drawing surface is positioned behind the back focus position b of the Fourier transform lens 34. In contrast, Example 3 has a feature in that a concave cylindrical lens 35 having a concave surface (negative power) in the direction parallel to the drawing surface is positioned in front of a focus position b as a mechanism for changing the rectangular shape, as shown in FIG. 3C. With this arrangement, in Example 3, the illumination width on the long side of the illumination shape can be changed by driving, using a driver 35a, the cylindrical lens 35 in the optical axis direction. As described above, the illumination width of the illumination shape can be changed. It is therefore possible to use the light intensity efficiently without decreasing it even if the shot size of a substrate 11 has been changed. As shown in the right portion of FIG. 3C, while the illumination shape before inserting the concave cylindrical lens 35 is the square, the aspect ratio of the illumination shape is changed and the hatched rectangular illumination shape is obtained by inserting the concave cylindrical lens 35.

[Article Manufacturing Method]

A manufacturing method of a device (a semiconductor integrated circuit device, a liquid crystal display device or the like) as an article includes a step of forming a pattern on a substrate (a wafer, a glass plate, or a film-like substrate) by using the above-described imprint apparatus. The manufacturing method can also include a step of etching the substrate onto which the pattern has been formed. Note that when manufacturing another article such as a patterned media (storage medium) or an optical element, the manufacturing method can include, instead of etching, another process of processing the substrate onto which the pattern has been formed. The method of manufacturing the article according to this embodiment is advantageous in at least one of the performance, the quality, the productivity, and the production cost of the article, as compared to a conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-164990, filed Aug. 13, 2014, which is hereby incorporated by reference herein in its entirety.

What is claimed is:

1. An imprint apparatus which performs an imprint process of forming a pattern on an imprint material of a substrate by bringing the imprint material and a mold pattern into contact with each other, the apparatus comprising:
    a heating unit configured to heat an imprint region where the imprint process on the substrate is performed and change a shape of the imprint region,
    wherein said heating unit includes a first optical system configured to emit a light beam extending in a first direction and a second direction perpendicular to an optical axis, a changing unit configured to change a ratio of widths of the light beam emitted from the first optical system in the first direction and the second direction, and an intensity distribution adjusting unit configured to adjust an intensity distribution of the light beam the ratio of which has been changed, and
    wherein said heating unit heats the imprint region by irradiating the imprint region with the light beam from the intensity distribution adjusting unit.

2. The apparatus according to claim 1, wherein the first optical system emits a rectangular light beam, and the changing unit changes an aspect ratio of the rectangular light beam emitted from the first optical system.

3. The apparatus according to claim 1, wherein the first optical system includes a light source unit and an optical system configured to uniformize an intensity distribution of light emitted from the light source unit.

4. The apparatus according to claim 3, wherein the optical system configured to uniformize the intensity distribution of light includes a lens array in which a plurality of lenses are arrayed two-dimensionally and a Fourier transform lens, and the changing unit includes a cylindrical lens positioned in an optical path between the Fourier transform lens and the intensity distribution adjusting unit.

5. The apparatus according to claim 4, wherein the cylindrical lens has a positive power and is positioned on a side closer to the light source unit than a back focus position of the Fourier transform lens.

6. The apparatus according to claim 4, wherein the cylindrical lens has a positive power and is positioned on a side closer to the intensity distribution adjusting unit than a back focus position of the Fourier transform lens.

7. The apparatus according to claim 4, wherein the cylindrical lens has a negative power and is positioned on a side closer to the light source unit than a back focus position of the Fourier transform lens.

8. The apparatus according to claim 4, wherein the changing unit includes a driver configured to drive the cylindrical lens in an optical axis direction.

9. The apparatus according to claim 8, further comprising:
    a detector configured to detect a mark formed in the imprint region; and a control unit configured to obtain a shape of the imprint region based on a detection result of said detector and control a driving amount of the driver based on the obtained shape.

10. The apparatus according to claim 4, wherein the plurality of lenses have the same focal length in the first direction and the second direction, and are arrayed with the same pitch in the first direction and the second direction.

11. The apparatus according to claim 3, wherein the light source unit includes a plurality of laser light sources, and an optical element configured to condense light from the plurality of laser light sources and guide the light to one fiber.

12. The apparatus according to claim 1, wherein the intensity distribution adjusting unit includes one of a liquid crystal device including a plurality of liquid crystal elements and configured to adjust the intensity distribution by controlling voltages for the plurality of liquid crystal elements and a digital mirror device including a plurality of mirror elements and configured to adjust the intensity distribution by controlling planar directions of the plurality of mirror elements.

13. The apparatus according to claim 1, wherein said heating unit includes a projection optical system configured to project, on the imprint region, the light beam, the intensity distribution of which has been adjusted by the intensity distribution adjusting unit.

14. The apparatus according to claim 1, further comprising a mold correction unit configured to correct a shape of the mold by applying a force to the mold.

* * * * *